(12) United States Patent
Takagi

(10) Patent No.: US 7,990,223 B1
(45) Date of Patent: Aug. 2, 2011

(54) HIGH FREQUENCY MODULE AND OPERATING METHOD OF THE SAME

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/976,207

(22) Filed: Dec. 22, 2010

(30) Foreign Application Priority Data

May 31, 2010 (JP) .................................. 2010-124234
May 31, 2010 (JP) .................................. 2010-124237

(51) Int. Cl.
*H03F 3/14* (2006.01)
(52) U.S. Cl. ...................... 330/307; 330/296; 330/302
(58) Field of Classification Search .................. 330/307, 330/296, 302
See application file for complete search history.

(56) References Cited

U.S. PATENT DOCUMENTS

| | | | | |
|---|---|---|---|---|
| 4,849,710 A * | 7/1989 | Vo | ................................. | 330/277 |
| 6,111,464 A * | 8/2000 | Laureanti | ....................... | 330/269 |
| 6,297,694 B1 * | 10/2001 | Yamamoto | ....................... | 330/51 |
| 6,344,775 B1 * | 2/2002 | Morizuka et al. | ............. | 330/288 |
| 6,400,035 B1 | 6/2002 | Hirata et al. | | |
| 6,946,896 B2 * | 9/2005 | Behzad | ......................... | 327/512 |
| 7,202,743 B2 * | 4/2007 | Enomoto | ....................... | 330/290 |
| 7,372,334 B2 * | 5/2008 | Blair et al. | ..................... | 330/302 |
| 7,411,288 B2 | 8/2008 | Takagi | | |
| 7,486,157 B2 | 2/2009 | Takagi | | |
| 7,576,423 B2 | 8/2009 | Takagi | | |
| 7,616,060 B2 * | 11/2009 | Yamamoto et al. | ........... | 330/284 |
| 7,659,613 B2 | 2/2010 | Takagi | | |
| 7,741,907 B2 | 6/2010 | Takagi | | |
| 2007/0007647 A1 | 1/2007 | Takagi | | |

FOREIGN PATENT DOCUMENTS

| | | |
|---|---|---|
| JP | 2-33963 | 2/1990 |
| JP | 2-69002 | 3/1990 |
| JP | 10-327028 | 12/1998 |

OTHER PUBLICATIONS

U.S. Appl. No. 12/786,942, filed May 25, 2010, Kazutaka Takagi.

* cited by examiner

*Primary Examiner* — Patricia Nguyen
(74) *Attorney, Agent, or Firm* — Oblon, Spivak, McClelland, Maier & Neustadt, L.L.P.

(57) ABSTRACT

According to one embodiment, provided is a high frequency module comprising: a semiconductor device; an input matching circuit; an output matching circuit; a high temperature operating use gate bias circuit and operating use gate bias circuit connected to the input matching circuit; a high temperature operating use gate bias terminal connected to the high temperature operating use gate bias circuit; an operating use gate bias terminal connected to the operating use gate bias circuit; a high frequency input terminal connected to the input matching circuit; a drain bias circuit connected to the output matching circuit; a drain bias terminal connected to the drain bias circuit; and a high frequency output terminal connected to the output matching circuit, wherein the high frequency module is housed by one package.

22 Claims, 14 Drawing Sheets

HIGH FREQUENCY MODULE AND OPERATING METHOD OF THE SAME

CROSS REFERENCE TO RELATED APPLICATIONS

This application is based upon and claims the benefit of priority from prior Japanese Patent Application No. P2010-124234 filed on May 31, 2010 and No. P2010-124237 filed on May 31, 2010, the entire contents of which are incorporated herein by reference.

FIELD

Embodiments described herein relate generally to a high frequency module and an operating method of such high frequency module.

BACKGROUND

In recent years, a high frequency semiconductor device has been applied to a cellular phone made a miniaturization and high-performance, and has spread rapidly. As technology which achieved the contribution largely to the progress, there is development of a high-performance field effect transistor. In particular a high-performance field effect transistor demonstrates performance excellent in high frequency characteristics, such as low voltage operation, high gain, a high-efficiency, low noise, and low distortion, and is applied as transmission and reception amplifier of a mobile terminal.

In a conventional high frequency semiconductor device, external power supply supplies gate voltage to a gate terminal of the high frequency semiconductor device via a bleeder resistance circuit, in order not to be based on a product but to communalize.

However, since resistance is inserted between gate power and gate terminal of the high frequency semiconductor device, if gate leakage current increases at the time of high temperature operating use, the value of gate bias voltage will become small. If the value of gate bias voltage becomes small, the phenomenon so-called bias jumping in which drain current increases and the temperature of the high frequency semiconductor device further rises with self-heating will occur. Accordingly, in the conventional high frequency semiconductor device, there is a problem that implementation of a high temperature electrical conducting test is difficult.

DETAILED DESCRIPTION

Figure 1A:
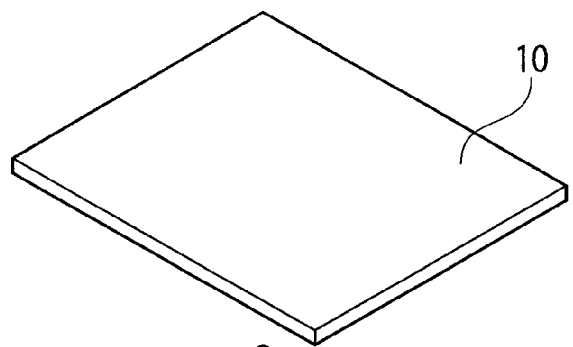
FIG. 1A is a schematic bird's-eye view configuration of a package for mounting a high frequency module according to a first embodiment, and is a schematic configuration diagram of a metal cap.
Figure 1B:
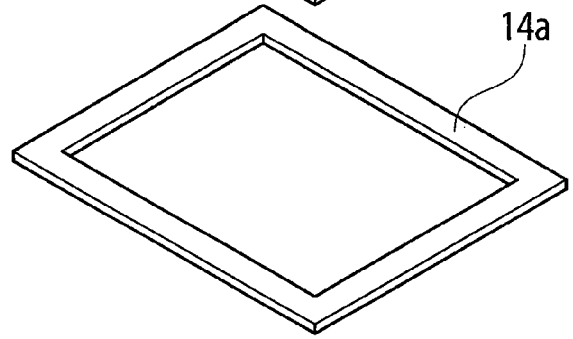
FIG. 1B is a schematic bird's-eye view configuration of the package for mounting the high frequency module according to the first embodiment, and is a schematic configuration diagram of a metal seal ring.
Figure 1C:
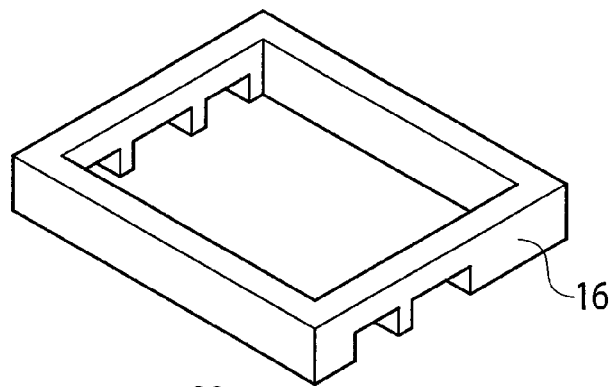
FIG. 1C is a schematic bird's-eye view configuration of the package for mounting the high frequency module according to the first embodiment, and is a schematic configuration diagram of a metallic wall.
Figure 1D:
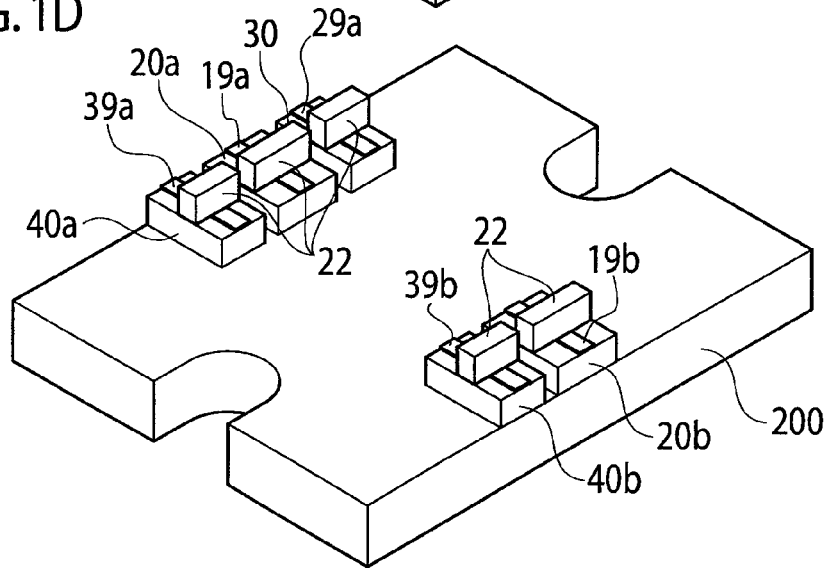
FIG. 1D is a schematic bird's-eye view configuration of the package for mounting the high frequency module according to the first embodiment, and is a schematic configuration diagram of a conductive base plate, a stripline disposed on an insulating layer, and an upper layer feed through disposed on an insulating layer.

Next, embodiments will be described with reference to drawings.

According to one embodiment, a high frequency module includes: a semiconductor device; an input matching circuit; an output matching circuit; a high temperature operating use gate bias circuit; an operating use gate bias circuit; a high temperature operating use gate bias terminal; an operating use gate bias terminal; a high frequency input terminal; a drain bias circuit; a drain bias terminal; and a high frequency output terminal.

The input matching circuit is disposed at the input side of the semiconductor device. The output matching circuit is disposed at the output side of the semiconductor device. The high temperature operating use gate bias circuit is connected to the input matching circuit. The operating use gate bias circuit is connected to the input matching circuit. The high temperature operating use gate bias terminal is connected to the high temperature operating use gate bias circuit. The operating use gate bias terminal is connected to the operating use gate bias circuit. The high frequency input terminal is connected to the input matching circuit. The drain bias circuit is connected to the output matching circuit. The drain bias terminal is connected to the drain bias circuit. The high frequency output terminal is connected to the output matching circuit. The semiconductor device, the input matching circuit, the output matching circuit, the high temperature operating use gate bias circuit, the operating use gate bias circuit, and the drain bias circuit are housed by one package.

According to another embodiment, in an operating method of a high frequency module, the high frequency module includes: a semiconductor device; an input matching circuit disposed at the input side of the semiconductor device; an output matching circuit disposed at the output side of the semiconductor device; an operating use gate bias circuit connected to the input matching circuit; an operating use gate bias terminal connected to the operating use gate bias circuit; a high frequency input terminal and high temperature operating use gate bias terminal connected to the input matching circuit; a drain bias circuit connected to the output matching circuit; a drain bias terminal connected to the drain bias circuit; and a high frequency output terminal connected to the output matching circuit, wherein the semiconductor device, the input matching circuit, the output matching circuit, the operating use gate bias circuit, and the drain bias circuit are housed by one package.

The operating method of the high frequency module includes: controlling, at the time of operating use, the potential of a gate terminal electrode of the semiconductor device via the operating use gate bias circuit; supplying, at the time of operating use, an input signal to the semiconductor device via a DC cutoff capacitor connected to the external of the high frequency input terminal and high temperature operating use gate bias terminal; and controlling, at the time of high temperature operating use, the potential of the gate terminal electrode of the semiconductor device by supplying gate bias voltage to the high frequency input terminal and high temperature operating use gate bias terminal.

First Embodiment

Package Structure

As shown in FIG. 1, a package for mounting a high frequency module 1 according to an embodiment includes: a metal cap 10; a metal seal ring 14a; a metallic wall 16; a conductive base plate 200; an input side insulating layers 20a, 30, and 40a disposed on the conductive base plate 200; an output side insulating layers 20b and 40b disposed on the conductive base plate 200; an input stripline 19a disposed on the input side insulating layer 20a; an output stripline 19b disposed on the output side insulating layer 20b; an input stripline 29a disposed on the input side insulating layer 30; an input stripline 39a disposed on the input side insulating layer 40a; an output stripline 39b disposed on the output side insulating layer 40b; and an upper layer feed through 22 disposed on the input side insulating layers 20a, 30, and 40a and the output side insulating layers 20b and 40b.

—Conductive Base Plate—

The conductive base plate 200 is formed of conductive metals, such as molybdenum and a copper molybdenum alloy, for example. Furthermore, electroplated conductors, such as Au, Ni, Ag, an Ag—Pt alloy and an Ag—Pd alloy, may be formed on the surface of the conductive base plate 200, for example. Also, layered structure, such as Cu/Mo/alumina substrate, may be used for the conductive base plate 200.

—Metallic Wall—

As a material of the metallic wall 16, it is formed of conductive metals, such as aluminum, molybdenum, and a copper molybdenum alloy, for example.

The soldering metal layer (not shown) for soldering is formed on the top surface of the metallic wall 16 via the metal seal ring 14a. The soldering metal layer can be formed of a gold germanium alloy, a gold tin alloy, etc., for example.

The metallic wall 16 is disposed on the conductive base plate 200 via an insulating or conductive adhesive material. In addition, the metallic wall 16 is disposed on a convex upper layer feed through 22 (refer to FIG. 1 and FIG. 3) in the feed through part. The convex upper layer feed through 22 is disposed on the input side insulating layers 20a, 30, and 40a and the output side insulating layers 20b and 40b, and is formed of an insulating layer. Here, the input side insulating layers 20a, 30, and 40a and the output side insulating layers 20b and 40b are equivalent to a lower layer feed through. The insulating adhesive material can be formed of an epoxy resin, glass, etc., for example, and the conductive adhesive material can be formed of a gold germanium alloy, a gold tin alloy, etc., for example.

—Metal Cap—

The metal cap 10 has a flat plate shape as shown in FIG. 1. The metal cap 10 is disposed via the metal seal ring 14a on the metallic wall 16.

The package for mounting the high frequency module 1 according to the first embodiment has a high frequency characteristic of not less than 3 GHz. Accordingly, it is applicable as a device and a package for component parts having high frequency (that is, frequency over 3 GHz).

(High Frequency Module)

—Planar Pattern Configuration—

Figure 2:
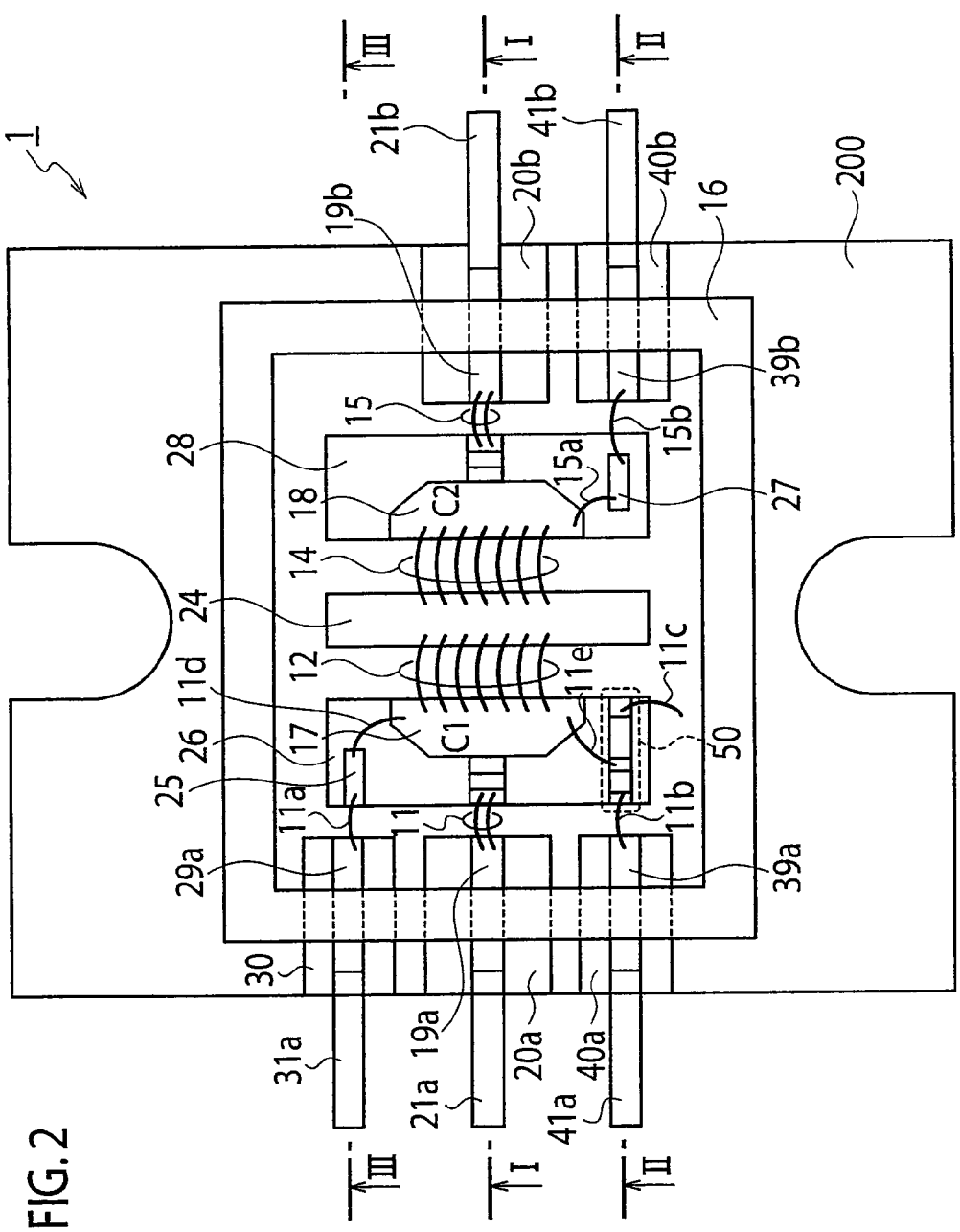
FIG. 2 is a schematic plane constitution diagram of the high frequency module according to the first embodiment.
Figure 3:
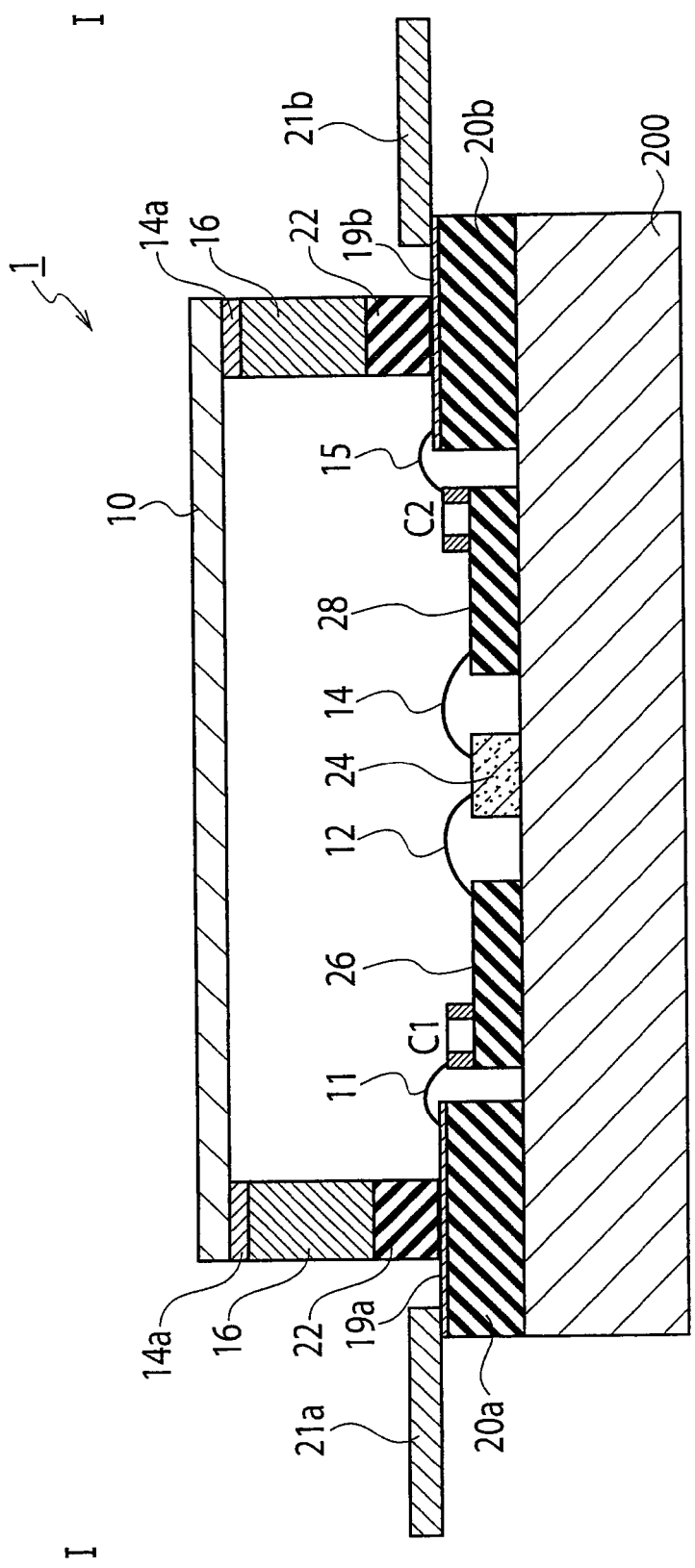
FIG. 3 is a schematic cross section configuration of the high frequency module according to the first embodiment, and is a schematic cross-sectional configuration diagram taken in the line I-I of FIG. 2.
Figure 4:
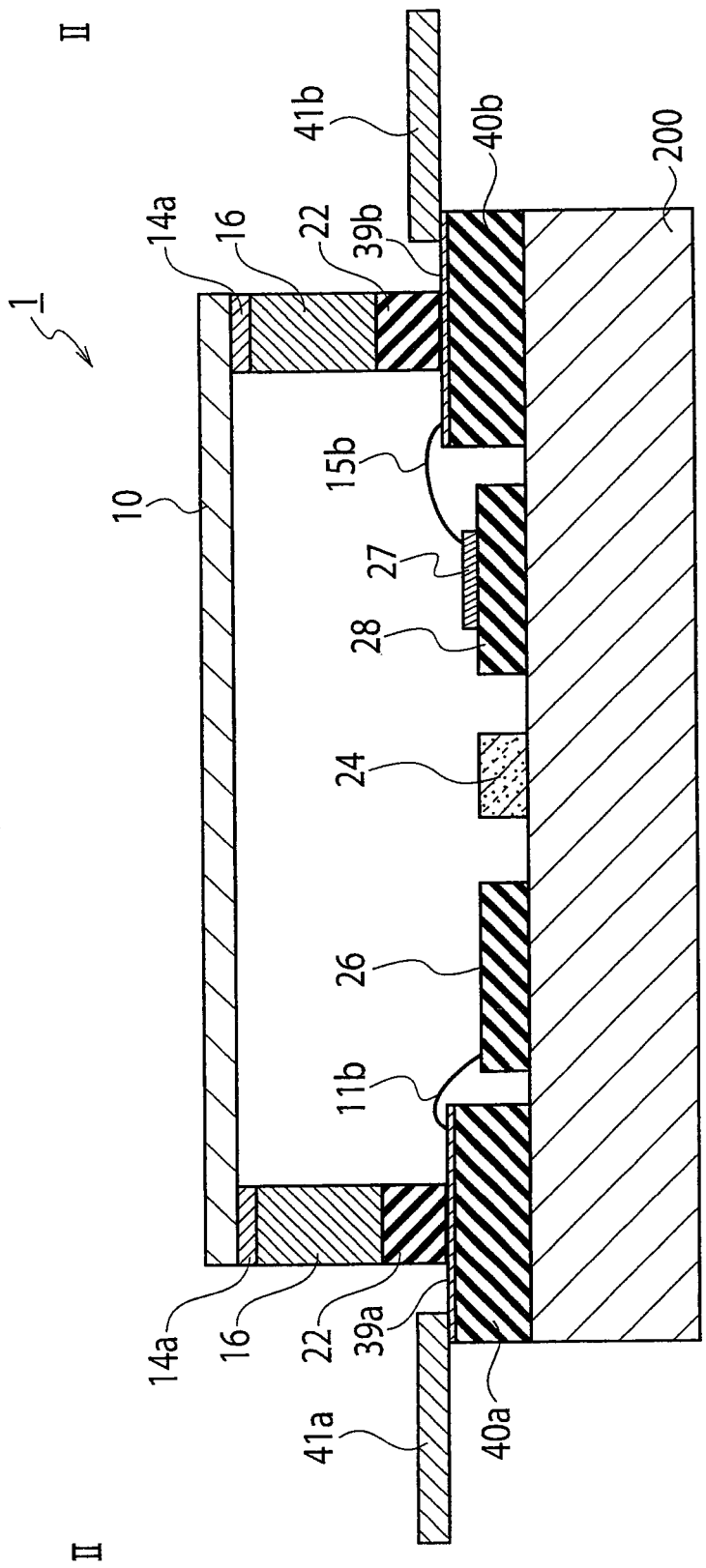
FIG. 4 is a schematic cross section configuration of the high frequency module according to the first embodiment, and is a schematic cross-sectional configuration diagram taken in the line II-II of FIG. 2.
Figure 5:
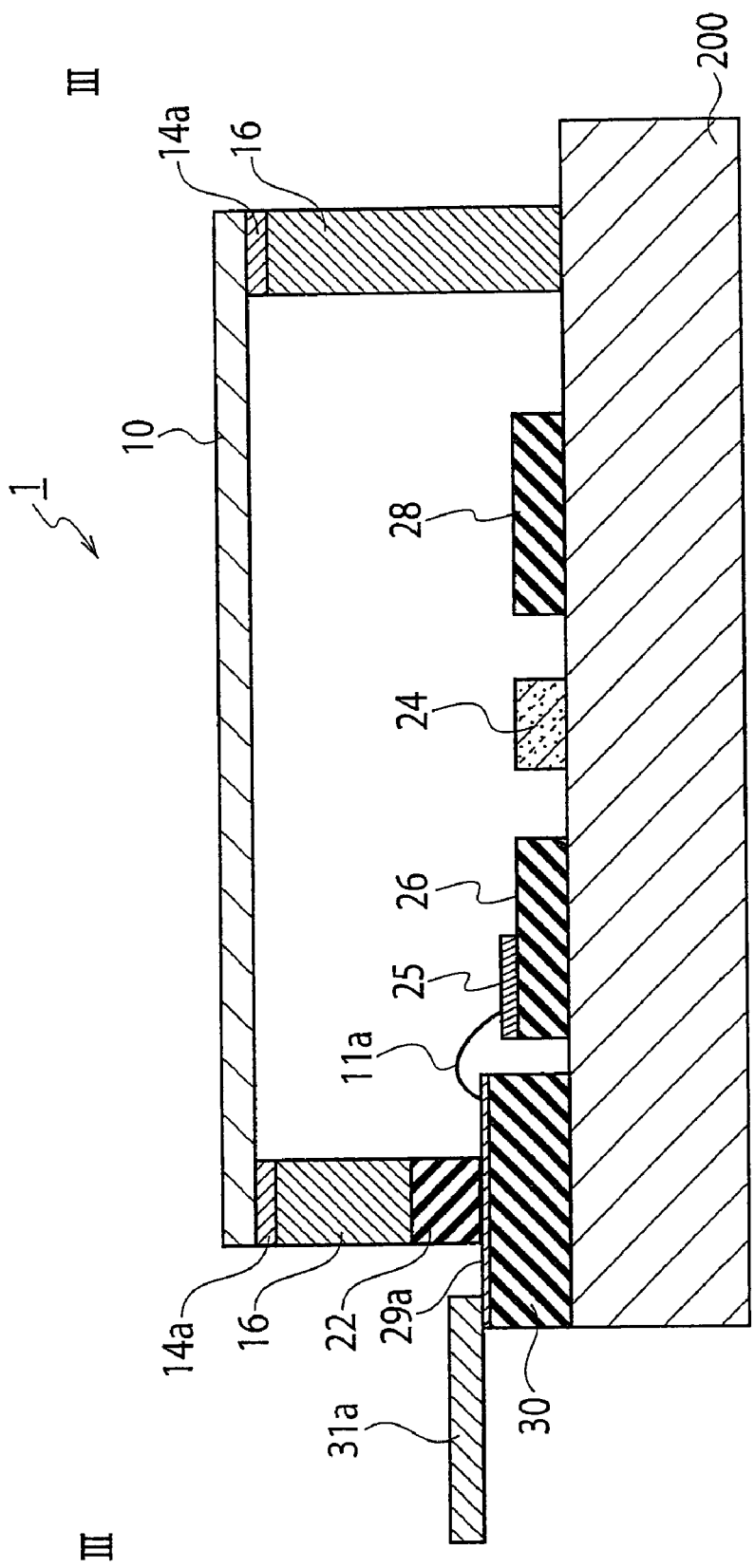
FIG. 5 is a schematic cross section configuration of the high frequency module according to the first embodiment, and is a schematic cross-sectional configuration diagram taken in the line III-III of FIG. 2.

A schematic planar pattern configuration of the high frequency module 1 according to the first embodiment is expressed as shown in FIG. 2, a schematic cross-section structure taken in the line I-I of FIG. 2 is expressed as shown in FIG. 3, a schematic cross-section structure taken in the line II-II of FIG. 2 is expressed as shown in FIG. 4, and a schematic cross-section structure taken in the line III-III of FIG. 2 is expressed as shown in FIG. 5.

As shown in FIG. 1 to FIG. 5, the high frequency module 1 according to the first embodiment includes: a semiconductor device 24 disposed on the conductive base plate 200; an input circuit substrate 26 disposed on the conductive base plate 200 at the input unit of the semiconductor device 24; and an output circuit substrate 28 disposed on the conductive base plate 200 at the output unit of the semiconductor device 24.

An input matching circuit 17, an electrode pattern 25, and a bleeder resistance circuit 50 are disposed on the input circuit substrate 26. Also, an output matching circuit 18 and an electrode pattern 27 are disposed on the output circuit substrate 28.

The input matching circuit 17 is connected to a gate terminal electrode G of the semiconductor device 24 via bonding wires 12, and the output matching circuit 18 is connected to a drain terminal electrode D of the semiconductor device 24 via bonding wires 14.

A high frequency input terminal 21a is connected to the input stripline 19a, and a high frequency output terminal 21b is connected to the output stripline 19b.

A high temperature operating use gate bias terminal 31a is connected to the input stripline 29a.

An operating use gate bias terminal 41a is connected to the input stripline 39a.

A drain bias terminal 41b is connected to the output stripline 39b.

The input stripline 29a is connected to an electrode pattern 25 via a bonding wire 11a, and the electrode pattern 25 is connected to the input matching circuit 17 via a bonding wire 11d. As a result, the high temperature operating use gate bias terminal 31a is connected to the gate terminal electrode G of the semiconductor device 24 via the input stripline 29a, the bonding wire 11a, the electrode pattern 25, the bonding wire 11d, and the input matching circuit 17.

At the time of the high temperature operating use, the high frequency module 1 according to the first embodiment is possible to be controlled directly of the potential of the gate terminal electrode G of the semiconductor device 24 by the voltage supplied to the high temperature operating use gate bias terminal 31a.

The input stripline 39a is connected to the bleeder resistance circuit 50 via a bonding wire 11b. The bleeder resistance circuit 50 is connected to the input matching circuit 17 via a bonding wire 11e, and is connected to ground potential via a bonding wire 11c.

The input stripline 19a is connected to an electrode of one side of DC cutoff capacitor C1 via a bonding wire 11, and the electrode of the another side of DC cutoff capacitor C1 is connected to the input matching circuit 17.

The output stripline 19b is connected to an electrode of one side of DC cutoff capacitor C2 via a bonding wire 15, and the electrode of the another side of DC cutoff capacitor C2 is connected to the output matching circuit 18.

The output stripline 39b is connected to the electrode pattern 27 via a bonding wire 15b, and the electrode pattern 27 is connected to the output matching circuit 18 via a bonding wire 15a. As a result, the drain bias terminal 41b is connected to a drain terminal electrode D of the semiconductor device 24 via the output stripline 39b, the bonding wire 15b, the electrode pattern 27, the bonding wire 15a, and the output matching circuit 18. At the time of high temperature operating use/at the time of operating use, the potential of the drain terminal electrode D of the semiconductor device 24 is possible to be controlled directly by voltage supplied to the drain bias terminal 41b. In addition, the source terminal electrode S of the semiconductor device 24 is connected to ground potential.

—Circuit Configuration—

Figure 6:
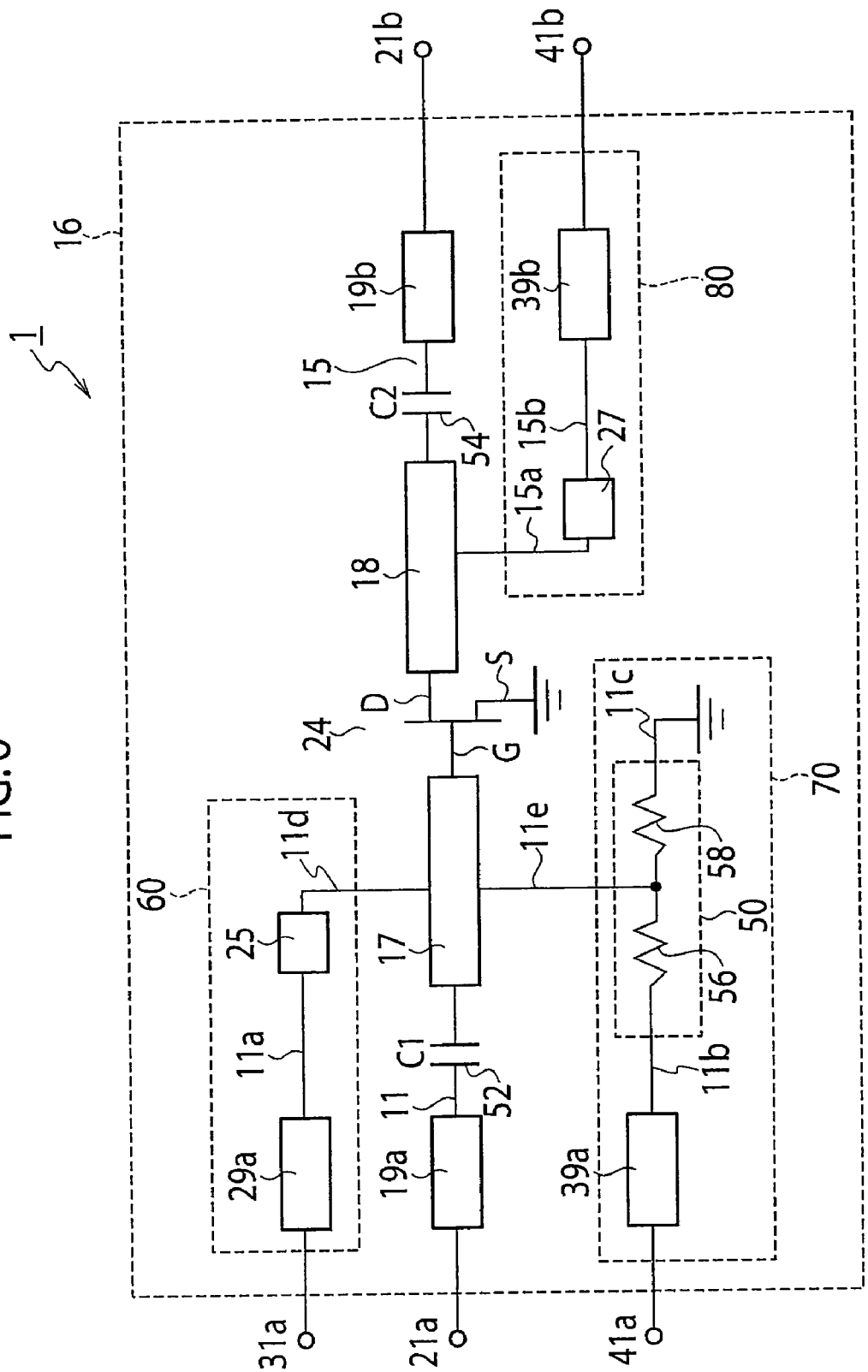
FIG. 6 is a schematic circuit configuration diagram of the high frequency module according to the first embodiment.
Figure 7A:
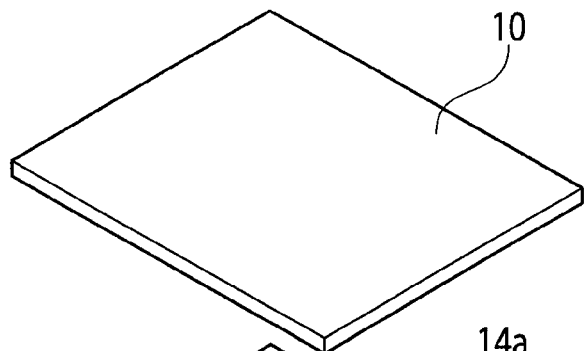
FIG. 7A is a schematic bird's-eye view configuration of a package for mounting a high frequency module according to the second embodiment, and is a schematic configuration diagram of a metal cap.
Figure 7B:
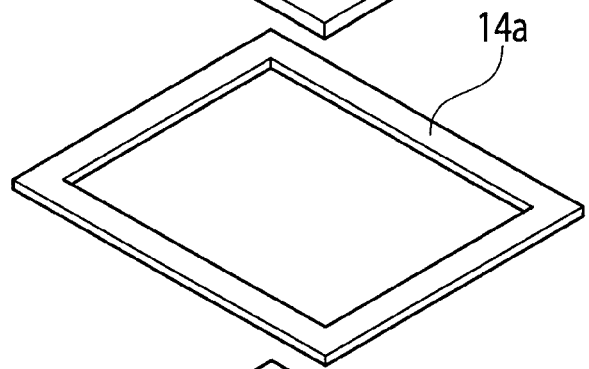
FIG. 7B is a schematic bird's-eye view configuration of the package for mounting the high frequency module according to the second embodiment, and is a schematic configuration diagram of a metal seal ring.
Figure 7C:
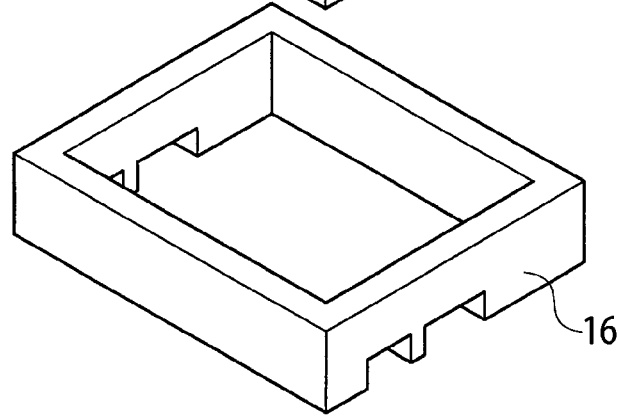
FIG. 7C is a schematic bird's-eye view configuration of the package for mounting the high frequency module according to the second embodiment, and is a schematic configuration diagram of a metallic wall.
Figure 7D:
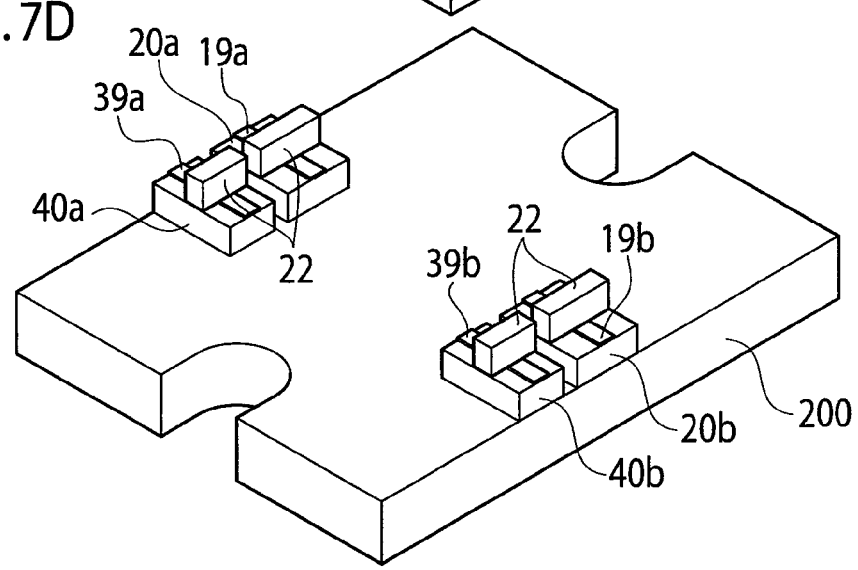
FIG. 7D is a schematic bird's-eye view configuration of the package for mounting the high frequency module according to the second embodiment, and is a schematic configuration diagram of a conductive base plate, a stripline disposed on an insulating layer, and an upper layer feed through disposed on an insulating layer.

As shown in FIG. 6, a schematic circuit configuration of the high frequency module 1 according to the first embodiment includes: the semiconductor device 24; the input matching circuit 17 disposed at the input side of the semiconductor device 24; the output matching circuit 18 disposed at the output side of the semiconductor device 24; the high temperature operating use gate bias circuit 60 connected to the input matching circuit 17; the operating use gate bias circuit 70 connected to the input matching circuit 17; the high temperature operating use gate bias terminal 31a connected to the high temperature operating use gate bias circuit 60; the operating use gate bias terminal 41a connected to the operating use gate bias circuit 70; the high frequency input terminal 21a connected to the input matching circuit 17; the drain bias circuit 80 connected to the output matching circuit 18; the drain bias terminal 41b connected to the drain bias circuit 80; and the high frequency output terminal 21b connected to the output matching circuit 18. The semiconductor device 24, the input matching circuit 17, the output matching circuit 18, the high temperature operating use gate bias circuit 60, the operating use gate bias circuit 70, and the drain bias circuit 80 are housed by one package surrounded with the metallic wall 16.

The operating use gate bias circuit 70 includes the bleeder resistance circuit 50, and the operating use gate bias terminal 41a is connected to the gate terminal electrode G of the semiconductor device 24 via the bleeder resistance circuit 50.

The bleeder resistance circuit 50 includes the bleeder resistance 56 connected to the operating use gate bias terminal 41a, and the bleeder resistance 58 by which series connection is performed between the ground potential and the bleeder resistance 56. The voltage supplied to the operating use gate bias terminal 41a is applied to the gate terminal electrode G of the semiconductor device 24 by the resistive voltage dividing both of the bleeder resistance 56 and the bleeder resistance 58.

The high temperature operating use gate bias circuit 60 includes the bonding wires 11a and 11d and the electrode pattern 25, and the high temperature operating use gate bias terminal 31a is connected to the gate terminal electrode G of the semiconductor device 24 via the high temperature operating use gate bias circuit 60.

The drain bias circuit 80 includes the bonding wires 15a and 15b and the electrode pattern 27, and the drain bias terminal 41b is connected to the drain terminal electrode D of the semiconductor device 24 via the drain bias circuit 80.

The voltage supplied to the high temperature operating use gate bias terminal 31a is applied to the gate terminal electrode G of the semiconductor device 24.

The voltage supplied to the drain bias terminal 41b is applied to the drain terminal electrode D of the semiconductor device 24.

The DC cutoff capacitor 52 is connected between the high frequency input terminal 21a and the input matching circuit 17, and the DC cutoff capacitor 54 is connected between the high frequency output terminal 21b and the output matching circuit 18.

At the time of high temperature current conducting operation, the high frequency module 1 according to the first embodiment can avoid bias jumping by using the high temperature operating use gate bias terminal 31a connected to the gate terminal electrode G of the semiconductor device 24, without via the bleeder resistance circuit.

Moreover, at the time of actual operating use, the high frequency module 1 according to the first embodiment does not depend the external power supply on a product but can be communalized by using the operating use gate bias terminal 41a connected to the gate terminal electrode G of the semiconductor device 24 via the bleeder resistance circuit 50.

According to the first embodiment, it can provide of a semiconductor module applicable to the high frequency of a microwave/millimeter wave/submillimeter wave band which can avoid bias jumping at the time of high temperature current conducting operation by using the high temperature operating use gate bias terminal 31*a* connected to the gate terminal electrode G of the semiconductor device 24 without via the bleeder resistance circuit, and which does not depend the external power supply on a product but can be communalized by using the operating use gate bias terminal 41*a* connected to the gate terminal electrode G of the semiconductor device 24 via the bleeder resistance circuit 50 at the time of actual operating use.

Second Embodiment

Package Structure

As shown in FIG. 7, a package for mounting a high frequency module 1 according to a second embodiment includes: a metal cap 10; a metal seal ring 14*a*; a metallic wall 16; a conductive base plate 200; an input side insulating layers 20*a* and 40*a* disposed on the conductive base plate 200; an output side insulating layers 20*b* and 40*b* disposed on the conductive base plate 200; an input stripline 19*a* disposed on the input side insulating layer 20*a*; an output stripline 19*b* disposed on the output side insulating layer 20*b*; an input stripline 39*a* disposed on the input side insulating layer 40*a*; an output stripline 39*b* disposed on the output side insulating layer 40*b*; and an upper layer feed through 22 disposed on the input side insulating layers 20*a*, and 40*a* and the output side insulating layers 20*b* and 40*b*.
—Conductive Base Plate—

The conductive base plate 200 is formed of conductive metals, such as molybdenum and a copper molybdenum alloy, for example. Furthermore, electroplated conductors, such as Au, Ni, Ag, an Ag—Pt alloy and an Ag—Pd alloy, may be formed on the surface of the conductive base plate 200, for example. Also, layered structure, such as Cu/Mo/alumina substrate, may be used for the conductive base plate 200.
—Metallic Wall—

As a material of the metallic wall 16, it is formed of conductive metals, such as aluminum, molybdenum, and a copper molybdenum alloy, for example.

The soldering metal layer (not shown) for soldering is formed on the top surface of the metallic wall 16 via the metal seal ring 14*a*. The soldering metal layer can be formed of a gold germanium alloy, a gold tin alloy, etc., for example.

Moreover, the metallic wall 16 is disposed on the conductive base plate 200 via an insulating or conductive adhesive material. In addition, the metallic wall 16 is disposed on a convex upper layer feed through 22 (refer to FIG. 7 and FIG. 9) in the feed through part. The convex upper layer feed through 22 is disposed on the input side insulating layers 20*a* and 40*a* and the output side insulating layers 20*b* and 40*b*, and is formed of an insulating layer. Here, the input side insulating layers 20*a* and 40*a* and the output side insulating layers 20*b* and 40*b* are equivalent to a lower layer feed through. The insulating adhesive material can be formed of an epoxy resin, glass, etc., for example, and the conductive adhesive material can be formed of a gold germanium alloy, a gold tin alloy, etc., for example.
—Metal Cap—

The metal cap 10 has a flat plate shape as shown in FIG. 7.

The metal cap 10 is disposed on the metallic wall 16 via the metal seal ring 14*a*.

The package for mounting the high frequency module 1 according to the second embodiment has a high frequency characteristic of not less than 3 GHz. Accordingly, it is applicable as a device and a package for component parts having high frequency (that is, frequency over 3 GHz).

(High Frequency Module)
—Planar Pattern Configuration—

Figure 8:
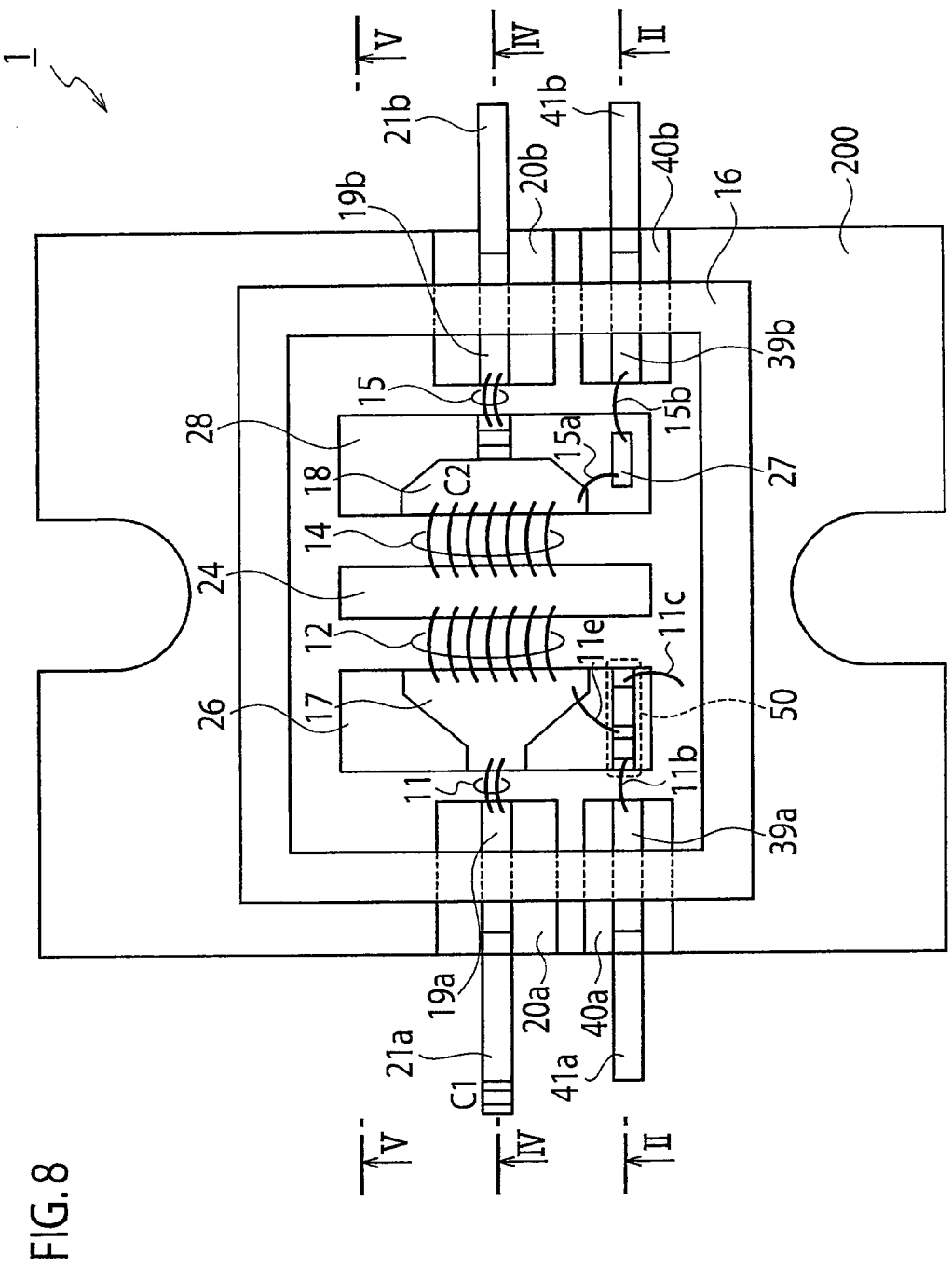
FIG. 8 is a schematic plane constitution diagram of the high frequency module according to the second embodiment.
Figure 9:
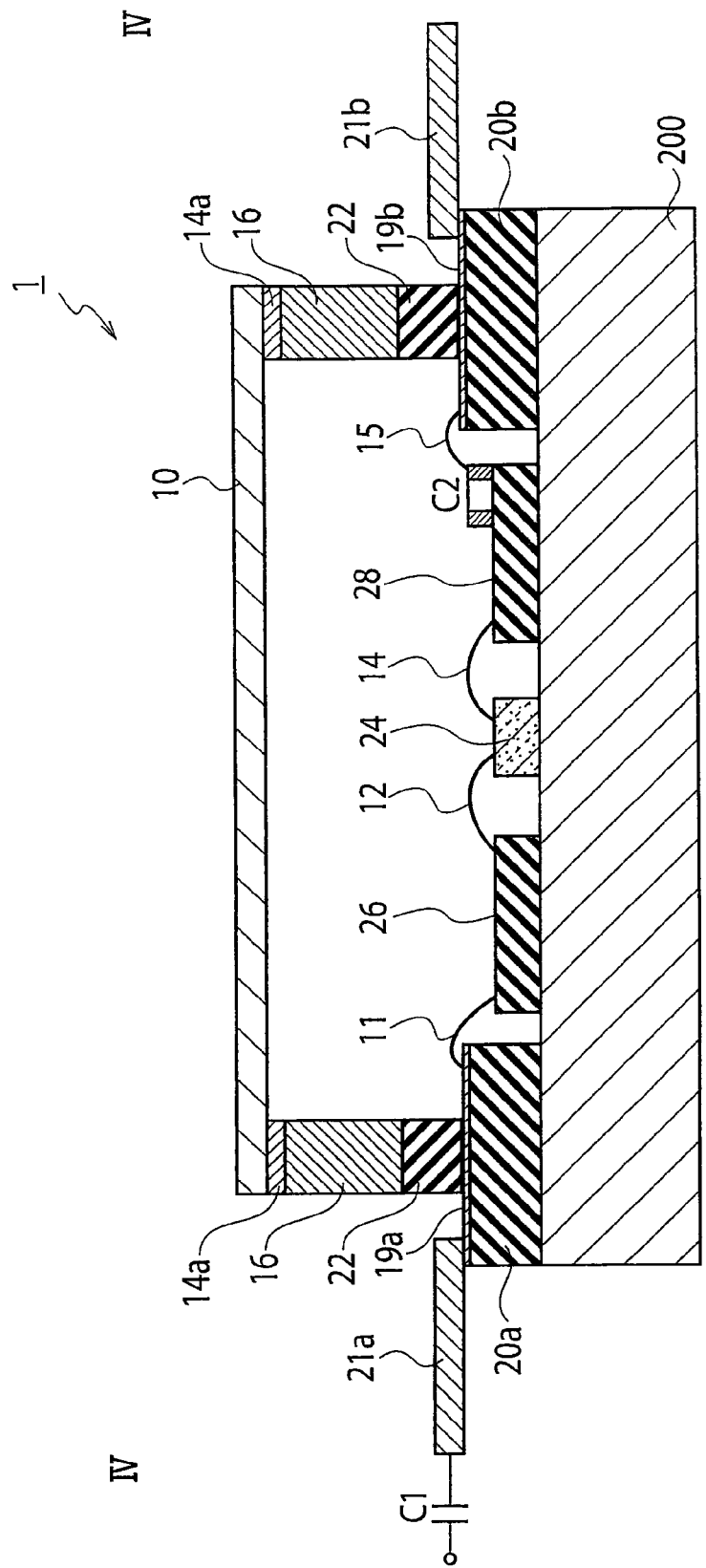
FIG. 9 is a schematic cross section configuration of the high frequency module according to the second embodiment, and is a schematic cross-sectional configuration chart taken in the line I-I of FIG. 8.
Figure 10:
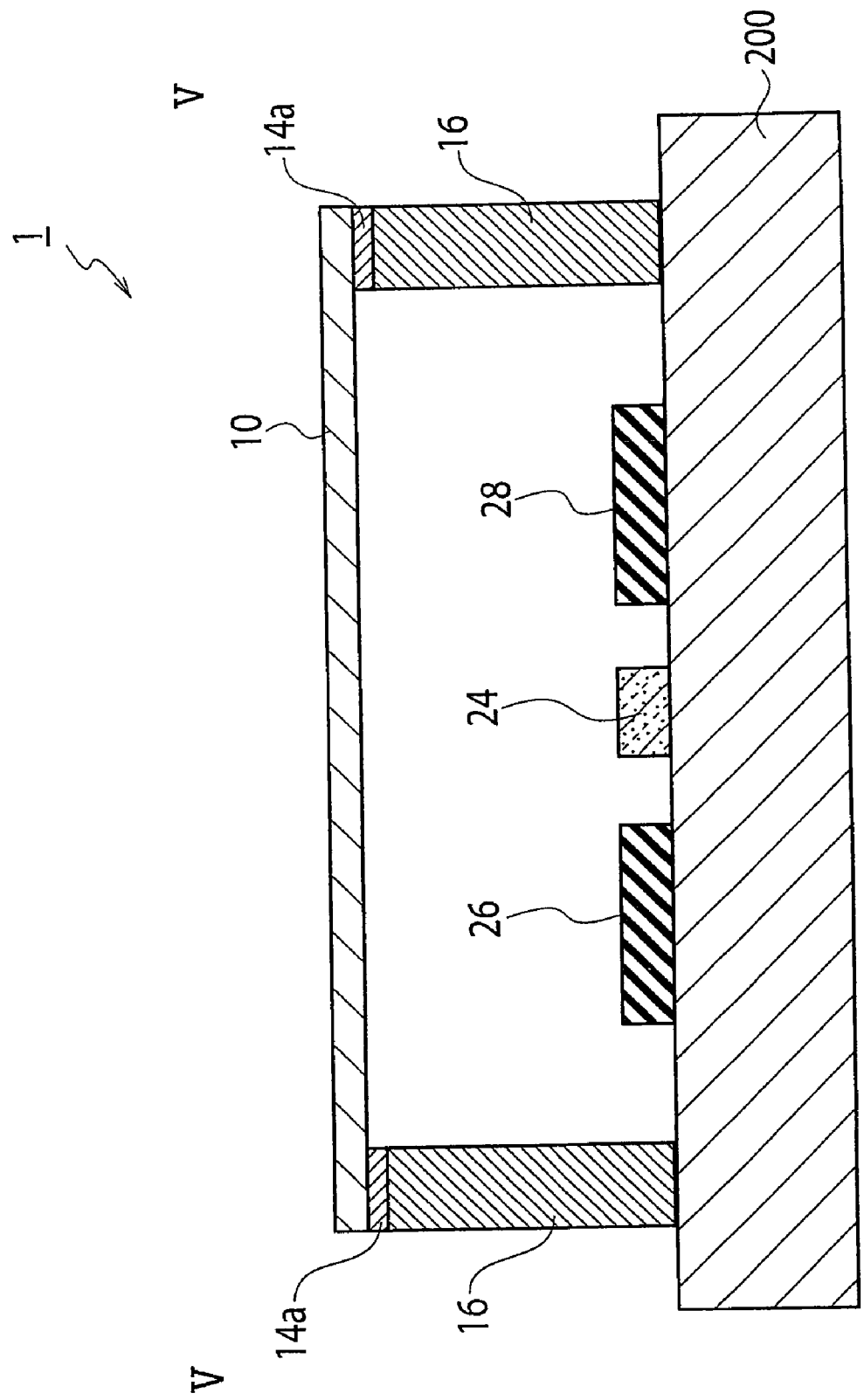
FIG. 10 is a schematic cross section configuration of the high frequency module according to the second embodiment, and is a schematic cross-sectional configuration chart taken in the III-III of FIG. 8.

A schematic planar pattern configuration of the high frequency module 1 according to the second embodiment is expressed as shown in FIG. 8, a schematic cross-section structure taken in the line IV-IV of FIG. 8 is expressed as shown in FIG. 9, a schematic cross-section structure taken in the line II-II of FIG. 8 is expressed as shown in FIG. 4 as well as the first embodiment, and a schematic cross-section structure taken in the line V-V of FIG. 8 is expressed as shown in FIG. 10.

As shown in FIG. 7 to FIG. 10, the high frequency module 1 according to the second embodiment includes: a semiconductor device 24 disposed on the conductive base plate 200; an input circuit substrate 26 disposed on the conductive base plate 200 at the input unit of the semiconductor device 24; and an output circuit substrate 28 disposed on the conductive base plate 200 at the output unit of the semiconductor device 24.

An input matching circuit 17, and a bleeder resistance circuit 50 are disposed on the input circuit substrate 26. Moreover, an output matching circuit 18 and an electrode pattern 27 are disposed on the output circuit substrate 28.

The input matching circuit 17 is connected to a gate terminal electrode G of the semiconductor device 24 via bonding wires 12, and the output matching circuit 18 is connected to a drain terminal electrode D of the semiconductor device 24 via bonding wires 14.

A high frequency input terminal and high temperature operating use gate bias terminal 21*a* is connected to the input stripline 19*a*, and a high frequency output terminal 21*b* is connected to the output stripline 19*b*.

The high frequency input terminal and high temperature operating use gate bias terminal 21*a* is connected to the gate terminal electrode G of the semiconductor device 24 via the input stripline 19*a*, the bonding wire 11, and the input matching circuit 17.

Also, DC cutoff capacitor C1 may be connected to the external of the high frequency input terminal and high temperature operating use gate bias terminal 21*a*.

An operating use gate bias terminal 41*a* is connected to the input stripline 39*a*.

A drain bias terminal 41*b* is connected to the output stripline 39*b*.

The input stripline 39*a* is connected to the bleeder resistance circuit 50 via the bonding wire 11*b*. The bleeder resistance circuit 50 is connected to the input matching circuit 17 via a bonding wire 11*e*, and is connected to ground potential via a bonding wire 11*c*.

The output stripline 19*b* is connected to an electrode of one side of DC cutoff capacitor C2 via a bonding wire 15, and the electrode of the another side of DC cutoff capacitor C2 is connected to the output matching circuit 18.

The output stripline 39*b* is connected to the electrode pattern 27 via a bonding wire 15*b*, and the electrode pattern 27 is connected to the output matching circuit 18 via a bonding wire 15*a*. As a result, the drain bias terminal 41*b* is connected to a drain terminal electrode D of the semiconductor device 24 via the output stripline 39*b*, the bonding wire 15*b*, the electrode pattern 27, the bonding wire 15*a*, and the output matching circuit 18. The potential of the drain terminal electrode D of the semiconductor device 24 is possible to be controlled directly by the voltage supplied to the drain bias terminal 41*b* at the time of high temperature operating use/at the time of operating use. In addition, the source terminal electrode S of the semiconductor device 24 is connected to ground potential.

—Circuit Configuration—

Figure 11:
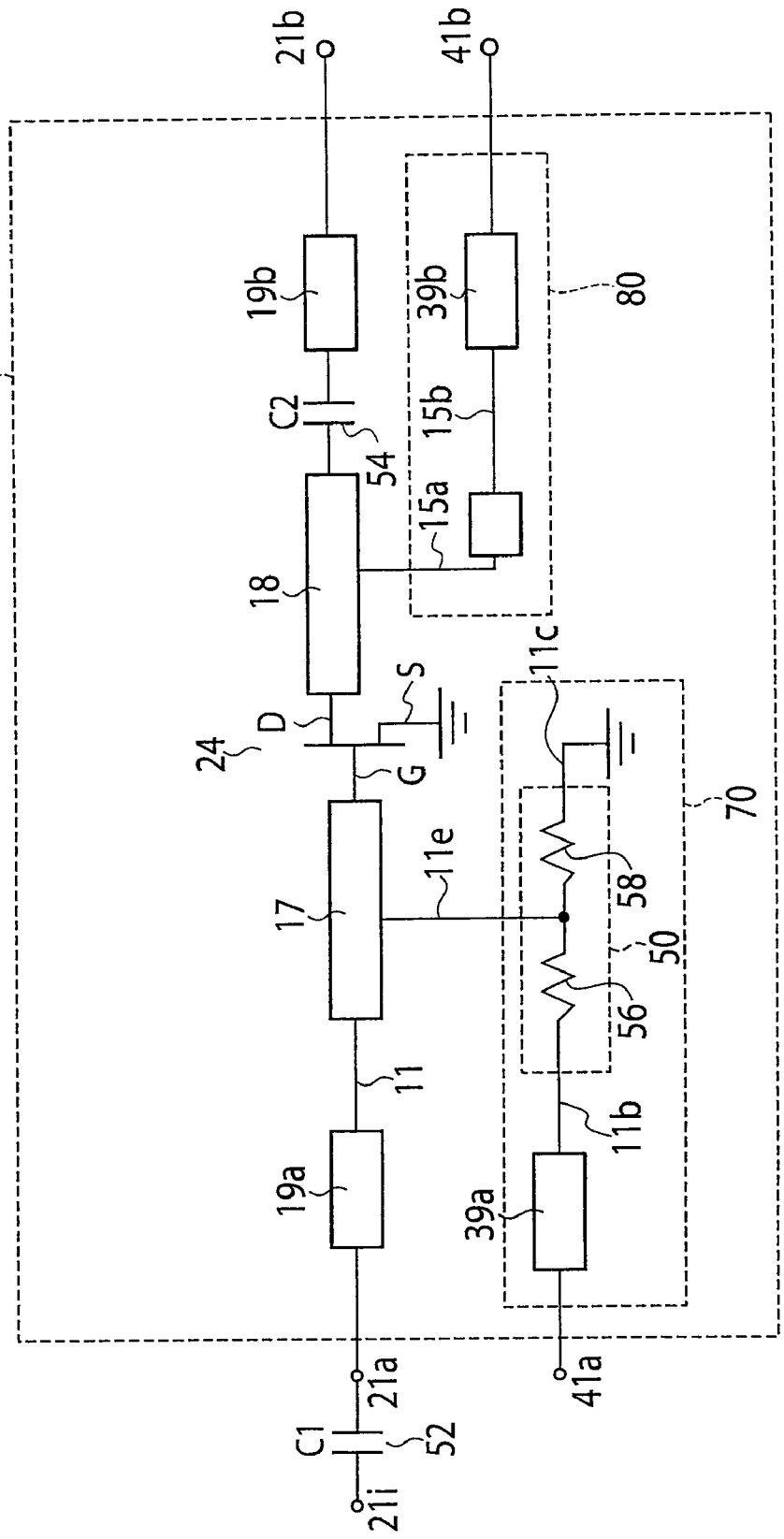
FIG. 11 is a schematic circuit configuration diagram of the high frequency module according to the second embodiment.

As shown in FIG. 11, a schematic circuit configuration of the high frequency module 1 according to the second embodiment includes: a semiconductor device 24; an input matching circuit 17 disposed at the input side of the semiconductor device 24; an output matching circuit 18 disposed at the output side of the semiconductor device 24; an operating use gate bias circuit 70 connected to the input matching circuit 17; an operating use gate bias terminal 41*a* connected to the operating use gate bias circuit 70; an high frequency input terminal and high temperature operating use gate bias terminal 21*a* connected to the input matching circuit 17; a drain bias circuit 80 connected to the output matching circuit 18; a drain bias terminal 41*b* connected to the drain bias circuit 80; and a high frequency output terminal 21*b* connected to the output matching circuit 18. The semiconductor device 24, the input matching circuit 17, the output matching circuit 18, the operating use gate bias circuit 70, and the drain bias circuit 80 are housed by one package surrounded with the metallic wall 16.

The operating use gate bias circuit 70 includes a bleeder resistance circuit 50, and the operating use gate bias terminal 41*a* is connected to the gate terminal electrode G of the semiconductor device 24 via the bleeder resistance circuit 50.

The bleeder resistance circuit 50 includes a bleeder resistance 56 connected to the operating use gate bias terminal 41*a*, and the bleeder resistance 58 by which series connection is performed between ground potential for the bleeder resistance 56, and the voltage supplied to the operating use gate bias terminal 41*a* is applied to the gate terminal electrode G of the semiconductor device 24 by the resistive voltage dividing both of the bleeder resistance 56 and the bleeder resistance 58.

Moreover, the electrode of one side of the DC cutoff capacitor 52 (C1) is connected to the external of high frequency input terminal and high temperature operating use gate bias terminal 21*a*, and the electrode of the another side of the DC cutoff capacitor 52 (C1) is connected to the input terminal 21*i* for introducing a high frequency input signal. As a result, an input signal is supplied to the semiconductor device 24 by supplying a high frequency input signal to the input terminal 21*i*. Moreover, at the time of the high temperature operating use, the potential of the gate terminal electrode G of the semiconductor device 24 is possible to be controlled directly via the input stripline 19*a*, the bonding wire 11, and the input matching circuit 17 by supplying gate bias voltage to the high frequency input terminal and high temperature operating use gate bias terminal 21*a*.

At the time of the high temperature operating use, as for the high frequency module 1 according to the second embodiment, the potential of the gate terminal electrode G of the semiconductor device 24 is possible to be controlled directly by the voltage supplied to the high frequency input terminal and high temperature operating use gate bias terminal 21*a*. That is, since the high frequency input terminal and the high temperature operating use gate bias terminal can be shared, the terminal number can be reduced and the configuration of the high frequency module 1 can be simplified.

Furthermore, the high frequency module corresponding to the user's intended use can be provided by making the DC cutoff capacitor C1 as the configuration in which external connection is possible.

The drain bias circuit 80 includes bonding wires 15*a* and 15*b* and an electrode pattern 27, and the drain bias terminal 41*b* is connected to the drain terminal electrode D of the semiconductor device 24 via the drain bias circuit 80.

The voltage supplied to the drain bias terminal 41*b* is applied to the drain terminal electrode D of the semiconductor device 24.

The DC cutoff capacitor 54 (C2) is connected between the high frequency output terminal 21*b* and the output matching circuit 18.

(Operating Method of High Frequency Module)

The high frequency module includes: a semiconductor device 24; an input matching circuit 17 disposed at the input side of the semiconductor device 24; an output matching circuit 18 disposed at the output side of the semiconductor device 24; an operating use gate bias circuit 70 connected to the input matching circuit 17; an operating use gate bias terminal 41*a* connected to the operating use gate bias circuit 70; an high frequency input terminal and high temperature operating use gate bias terminal 21*a* connected to the input matching circuit 17; a drain bias circuit 80 connected to the output matching circuit 18; a drain bias terminal 41*b* connected to the drain bias circuit 80; and a high frequency output terminal 21*b* connected to the output matching circuit 18. The semiconductor device 24, the input matching circuit 17, the output matching circuit 18, the operating use gate bias circuit 70, and the drain bias circuit 80 are housed by one package. An operating method of such high frequency module includes: controlling, at the time of operating use, the potential of the gate terminal electrode G of the semiconductor device 24 via the operating use gate bias circuit 70; supplying, at the time of operating use, an input signal to the semiconductor device 24 via the DC cutoff capacitor 52 (C1) connected to the external of the high frequency input terminal and high temperature operating use gate bias terminal 21*a*; and controlling, at the time of high temperature operating use, the potential of the gate terminal electrode G of the semiconductor device 24 by supplying gate bias voltage to the high frequency input terminal and high temperature operating use gate bias terminal 21*a*.

The operating use gate bias circuit 70 includes the bleeder resistance circuit 50, and may control the potential of the gate terminal electrode G of the semiconductor device 24 via the bleeder resistance circuit 50 at the time of operating use.

At the time of high temperature current conducting operation, the high frequency module 1 according to the second embodiment can avoid bias jumping by using the high frequency input terminal and high temperature operating use gate bias terminal 21*a* connected to the gate terminal electrode G of the semiconductor device 24, without via the bleeder resistance circuit.

Moreover, at the time of actual operating use, the high frequency module 1 according to the second embodiment does not depend the external power supply on a product but can be communalized by using the operating use gate bias terminal 41*a* connected to the gate terminal electrode G of the semiconductor device 24 via the bleeder resistance circuit 50.

According to the second embodiment, it can provide of a semiconductor module and an operating method of such semiconductor module at the time of high temperature current conducting operation, the bias jumping is avoidable by using the high frequency input terminal and high temperature operating use gate bias terminal 21*a* connected to the gate terminal electrode G of the semiconductor device 24, without via the bleeder resistance circuit, and at the time of actual operating use, applicable to the high frequency of a microwave/millimeter wave/submillimeter wave band which does not depend the external power supply on a product but can be communalized by using the operating use gate bias terminal 41a connected to the gate terminal electrode G of the semiconductor device 24 via the bleeder resistance circuit 50.

(Configuration of Semiconductor Device)

Figure 12A:
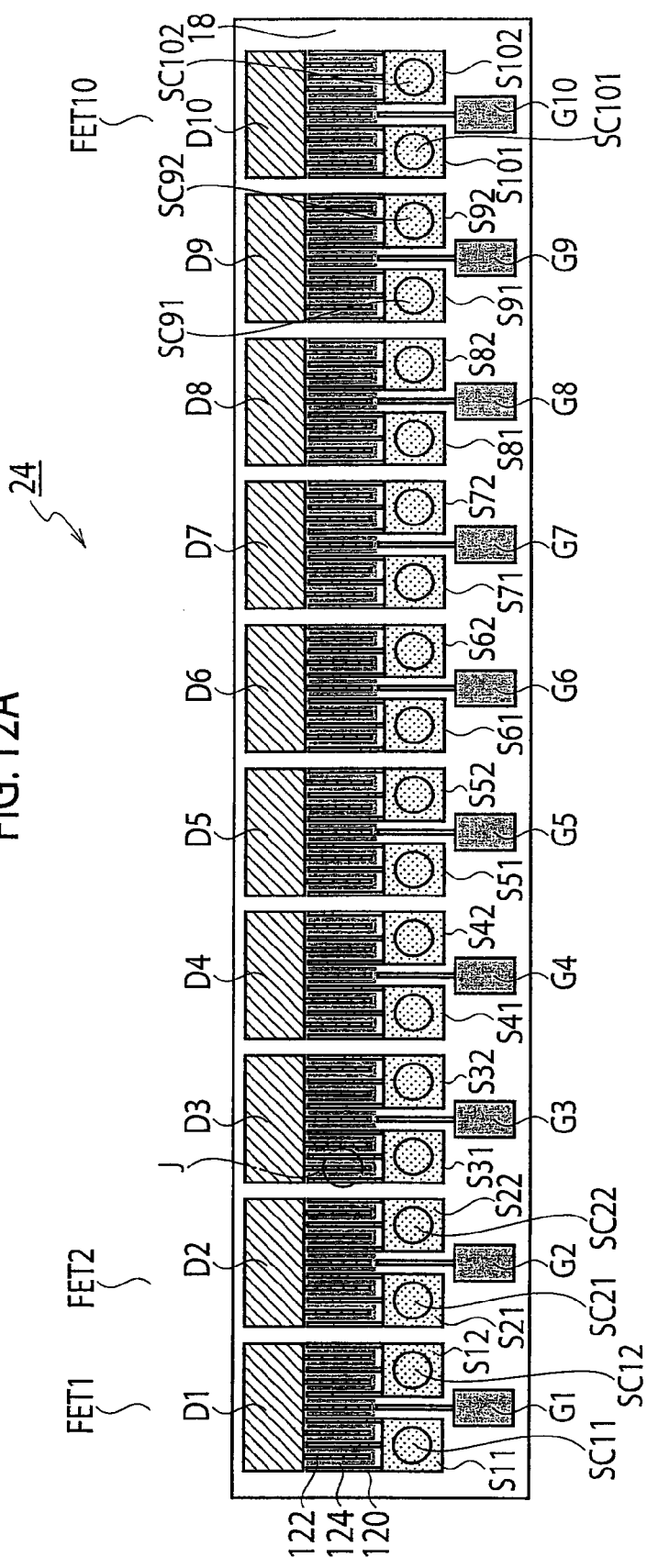
FIG. 12A is an enlarged drawing of a schematic planar pattern configuration of a semiconductor device in the high frequency module according to the first embodiment.
Figure 12B:
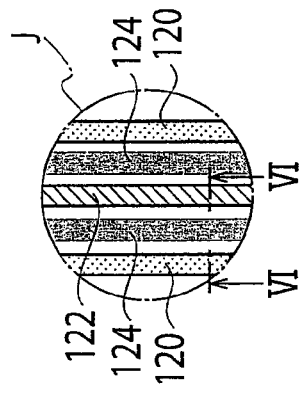
FIG. 12B is an enlarged drawing of J part of FIG. 12A.

An enlarged drawing of a schematic planar pattern configuration of the semiconductor device 24 applied to the high frequency module 1 according to the first and second embodiments is expressed as shown in FIG. 12A, and an enlarged drawing of J part of FIG. 12A is expressed as shown in FIG. 12B. Also, constructional examples 1-4 of the semiconductor device 24 applied to the high frequency module 1 according to the embodiment, and schematic cross-section structure examples taken in the line VI-VI of FIG. 12B are expressed as shown in FIG. 13 to FIG. 16, respectively.

In the semiconductor device 24 applied to the high frequency module 1 according to the first and second embodiments, as shown in FIG. 12 to FIG. 16, a plurality of FET cells FET 1 to FET 10 include: a semi-insulating substrate 110; a gate finger electrode 124, a source finger electrode 120, and a drain finger electrode 122 which are disposed on a first surface of the semi-insulating substrate 110, and have a plurality of fingers, respectively; a plurality of gate terminal electrodes G1, G2, ..., G10, a plurality of source terminal electrodes S11, S12, S21, S22, ..., S101, and S102 and the drain terminal electrodes D1, D2, ..., D10 which are disposed on the first surface of the semi-insulating substrate 110, and ties a plurality of fingers, respectively every the gate finger electrode 124, the source finger electrode 120, and the drain finger electrode 122; VIA holes SC11, SC12, SC21, SC22, ..., SC101, and SC102 disposed at the lower part of the source terminal electrodes S11, S12, S21, S22, ..., S101, and S102; and a ground electrode (not shown) which is disposed on a second surface of the opposite side of the first surface of the semi-insulating substrate 110, and is connected via the VIA holes SC11, SC12, SC21, SC22, ..., SC101, and SC102 with the source terminal electrodes S11, S12, S21, S22, ..., S101, and S102.

The bonding wire 12 is connected to the gate terminal electrodes G1, G2, ..., G10; the bonding wire 14 is connected to the drain terminal electrodes D1, D2, ..., D10; the VIA holes SC11, SC12, SC21, SC22, ..., SC101, and SC102 are formed in the lower part of the source terminal electrodes S11, S12, S21, S22, ..., S101, and S102; the barrier metal layers (not shown) formed in the internal wall of the VIA holes SC11, SC12, SC21, SC22, ..., SC101 and SC102; and the source terminal electrode S11, S12, S21, S22, ..., S101, and S102 formed on the barrier metal layers and connected to the ground electrode via the filling metal layers (not shown) filled up with the VIA holes.

The semi-insulating substrate 110 is either of a GaAs substrate, an SiC substrate, a GaN substrate, a substrate in which a GaN epitaxial layer is formed on the SiC substrate, a substrate which a heterojunction epitaxial layer composed of GaN/AlGaN is formed on the SiC substrate, a sapphire substrate or a diamond substrate.

Constructional Example 1

Figure 13:
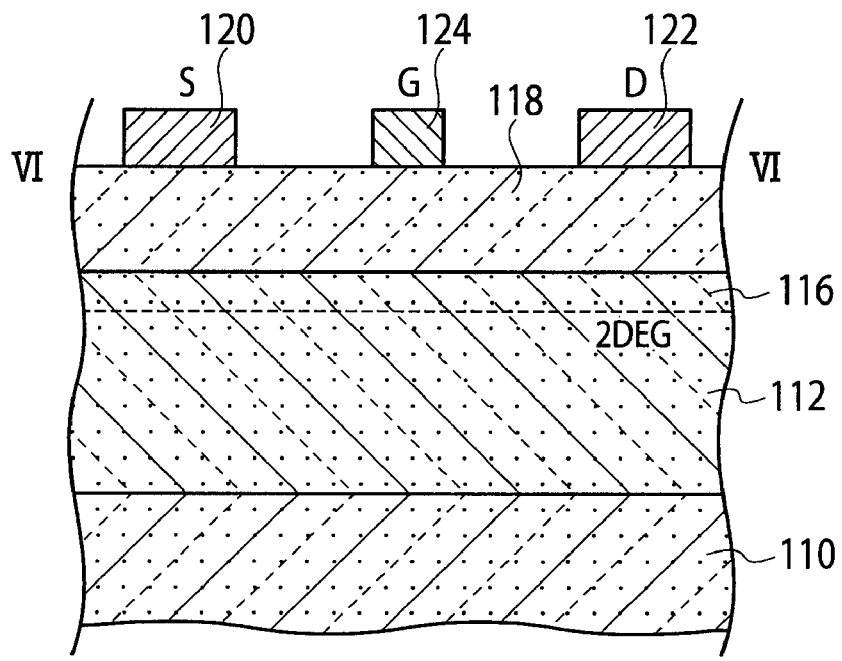
FIG. 13 is a constructional example 1 of a semiconductor device applied to the high frequency module according to the first embodiment, and is a schematic cross-sectional configuration diagram taken in the line IV-IV of FIG. 12B.

As shown in FIG. 13, a constructional example 1 of the FET cell of the semiconductor device 24 applied to the high frequency module 1 according to the first and second embodiments as a schematic cross section configuration taken in the line VI-VI of FIG. 12B includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; and a source finger electrode 120, a gate finger electrode 124, and a drain finger electrode 122 which are disposed on the aluminum gallium nitride layer ($Al_xGa_{1-x}N$) (where $0.1<=x<=1$) 118. A two dimensional electron gas (2DEG) layer 116 is formed in the interface between the nitride based compound semiconductor layer 112 and the aluminum gallium nitride layer ($Al_xGa_{1-x}N$) (where $0.1<=x<=1$) 118. FIG. 13 shows a Hetero-junction Field Effect Transistor (HFET) or a High electron mobility transistor (HEMT) as the constructional example 1.

Constructional Example 2

Figure 14:
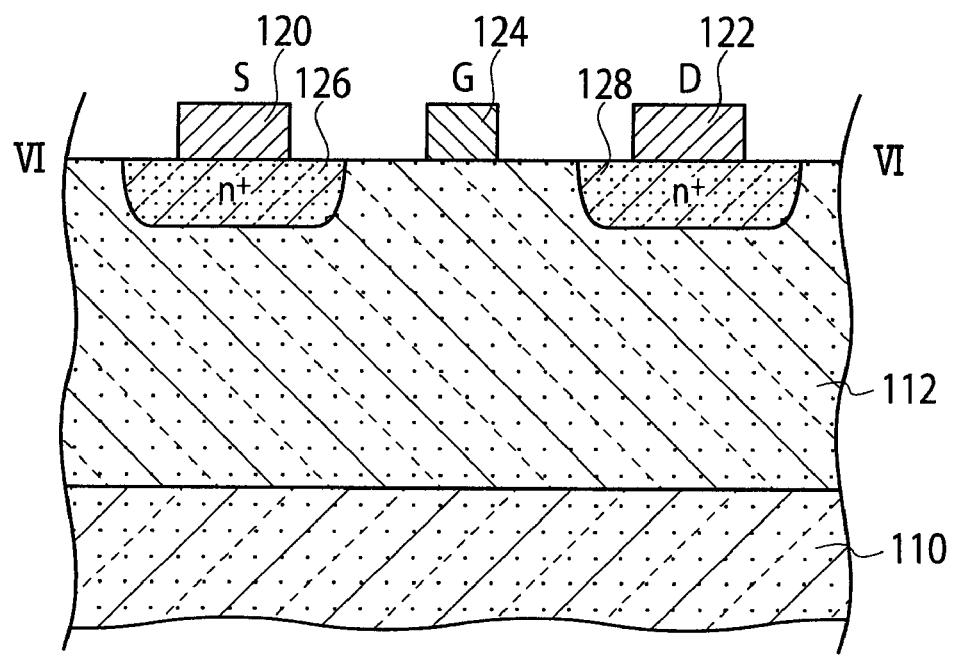
FIG. 14 is a constructional example 2 of a semiconductor device applied to the high frequency module according to the first embodiment, and is a schematic cross-sectional configuration chart taken in the line IV-IV of FIG. 12B.

As shown in FIG. 14, a constructional example 2 of the FET cell of the semiconductor device 24 applied to the high frequency module 1 according to the first and second embodiments as a schematic cross section configuration taken in the line VI-VI of FIG. 12B includes: a semi-insulating substrate 110; a nitride based compound semiconductor layer 112 disposed on the semi-insulating substrate 110; a source region 126 and a drain region 128 which are disposed on the nitride based compound semiconductor layer 112; and a source finger electrode 120 disposed on the source region 126, a gate finger electrode 124 disposed on the nitride based compound semiconductor layer 112 and a drain finger electrode 122 disposed on the drain region 128. Schottky contact is formed in the interface between the nitride based compound semiconductor layer 112 and the gate finger electrode 124. FIG. 14 shows a Metal Semiconductor Field Effect Transistor (MESFET) as the constructional example 2.

Constructional Example 3

Figure 15:
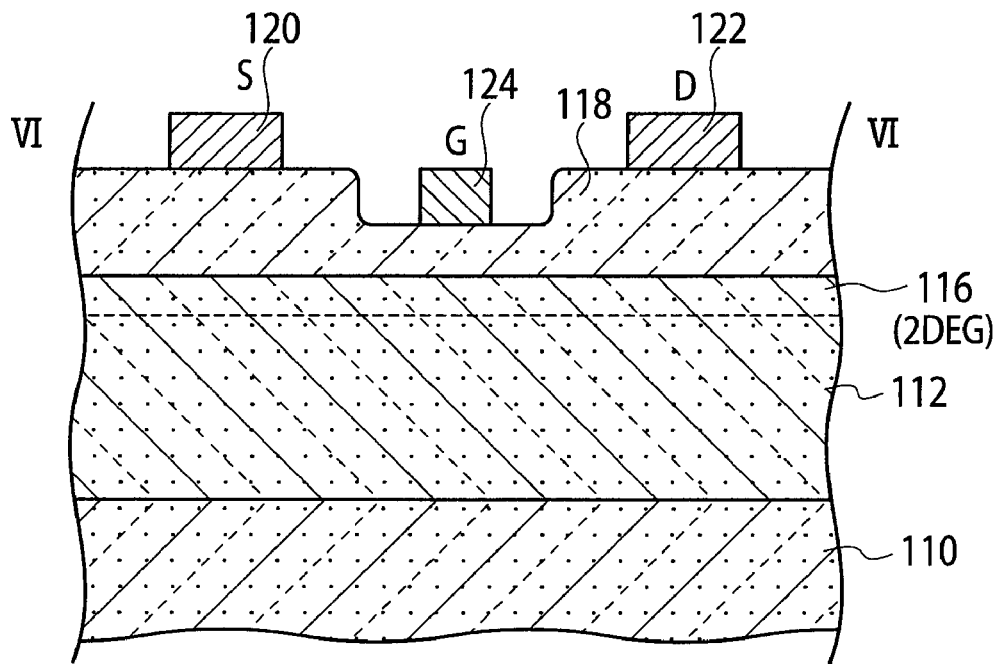
FIG. 15 is a constructional example 3 of a semiconductor device applied to the high frequency module according to the first embodiment, and is a schematic cross-sectional configuration chart taken in the line IV-IV of FIG. 12B.

As shown in FIG. 15, a constructional example 3 of the FET cell of the semiconductor device 24 applied to the high frequency module 1 according to the first and second embodiments as a schematic cross section configuration taken in the line VI-VI of FIG. 12B includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode 120 and a drain finger electrode 122 which are disposed on the aluminum gallium nitride layer ($Al_xGa_{1-x}N$) (where $0.1<=x<=1$) 118; and a gate finger electrode 124 disposed at a recessed part on the aluminum gallium nitride layer ($Al_xGa_{1-x}N$) (where $0.1<=x<=1$) 118. The 2DEG layer 116 is formed in the interface between the nitride based compound semiconductor layer 112 and the aluminum gallium nitride layer ($Al_xGa_{1-x}N$) (where $0.1<=x<=1$) 118. FIG. 15 shows HFET or HEMT as the constructional example 3.

Constructional Example 4

Figure 16:
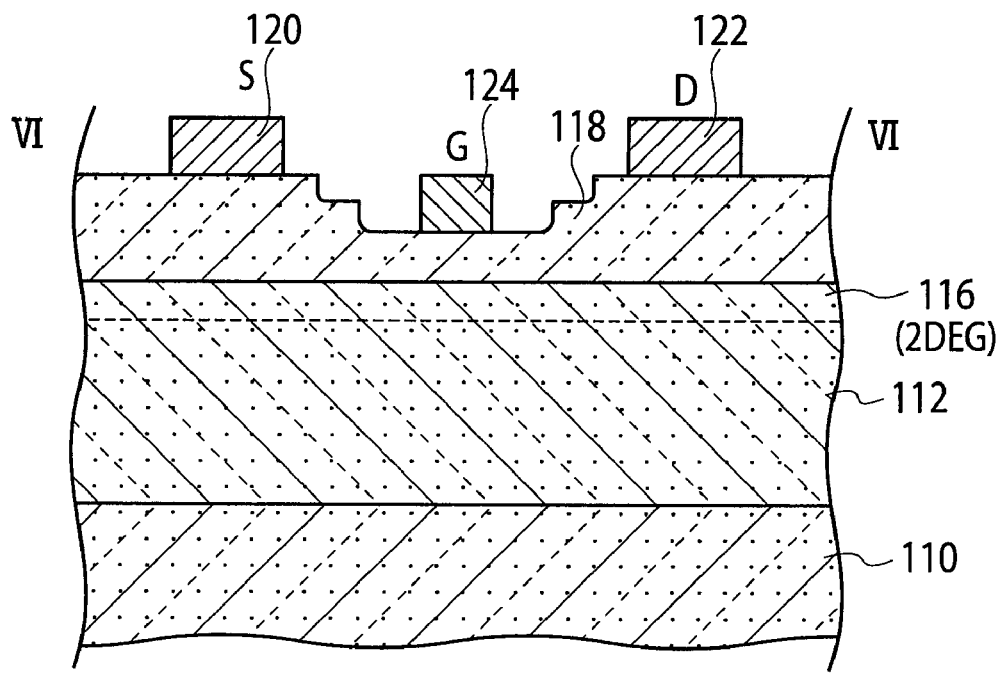
FIG. 16 is a constructional example 4 of a semiconductor device applied to the high frequency module according to the first embodiment, and is a schematic cross-sectional configuration chart taken in the line IV-IV of FIG. 12B.

As shown in FIG. 16, a constructional example 4 of the FET cell of the semiconductor device 24 applied to the high frequency module 1 according to the first and second embodiments as a schematic cross section configuration taken in the line VI-VI of FIG. 12B includes: a semi-insulating substrate 110; a nitride based compound semiconductor layer 112 disposed on the semi-insulating substrate 110; an aluminum gallium nitride layer ($Al_xGa_{1-x}N$) (where $0.1<=x<=1$) 118 disposed on the nitride based compound semiconductor layer 112; a source finger electrode 120 and a drain finger electrode 122 which are disposed on the aluminum gallium nitride layer ($Al_xGa_{1-x}N$) (where $0.1<=x<=1$) 118; and a gate finger electrode 124 disposed at a two-step recessed part on the aluminum gallium nitride layer ($Al_xGa_{1-x}N$) (where $0.1<=x<=1$) 118. The 2DEG layer 116 is formed in the interface between the nitride based compound semiconductor layer 112 and the aluminum gallium nitride layer ($Al_xGa_{1-x}N$) (where $0.1<=x<=1$) 118. FIG. 16 shows HFET or HEMT as the constructional example 4.

Moreover, in the above-mentioned constructional examples 1-4, the nitride based compound semiconductor layer 112 except an active area is electrically used as an inactivity isolation region. Here, the active area is composed of the source finger electrode 120, the 2DEG layer 116 directly under the gate finger electrode 124 and the drain finger electrode 122, and the 2DEG layer 116 between the source finger electrode 120 and the gate finger electrode 124 and between the drain finger electrode 122 and the gate finger electrode 124. In the above-mentioned constructional examples 1-4, the nitride based compound semiconductor layer 112 except the active area is electrically used as the inactivity isolation region.

As another fabrication method of the isolation region, it can also form by ion implantation to a part of depth direction of the aluminum gallium nitride layer ($Al_xGa_{1-x}N$) (where $0.1<=x<=1$) 18 and the nitride based compound semiconductor layer 112. As ion species, nitrogen (N), argon (Ar), etc. are applicable, for example. Moreover, the amount of dosage with the ion implantation is about $1\times10^{14}$ (ions/cm$^2$), for example, and accelerating energy is about 100 keV to 200 keV, for example.

On the isolation region and the device surface, an insulating layer for passivation (not shown) is formed. As the insulating layer, it can be formed of a nitride film, an alumina ($Al_2O_3$) film, an oxide film ($SiO_2$) an oxynitriding film (SiON), etc. deposited by a Plasma Enhanced Chemical Vapor Deposition (PECVD) method, for example.

The source finger electrode 120 and the drain finger electrode 122 are formed of Ti/Al etc., for example. The gate finger electrode 124 can be formed, for example of Ni/Au etc.

In addition, the pattern length of the longitudinal direction of the gate finger electrode 124, the source finger electrode 120, and the drain finger electrode 122 is set up to be short as the operating frequency becomes high such the microwave/millimeter wave/submillimeter wave. For example, in the millimeter wave band, the pattern length is about 25 μm to 50 μm.

Also, the width of the source finger electrode 120 is about 40 μm, for example, and the width of the source terminal electrode S11, S12, S21, S22, . . . , S101, and S102 is about 100 μm, for example, the formation width of the VIA holes SC11, SC12, SC21, SC22, . . . , SC101, and SC102 is about 10 μm to about 40 μm, for example.

According to the embodiment described above, it can provide of a semiconductor module applicable to the high frequency of a microwave/millimeter wave/submillimeter wave band which can avoid bias jumping at the time of high temperature current conducting operation, and does not depend the external power supply on a product, but can be communalized at the time of actual operating use.

In addition, as the element applied to a high frequency module, it needless to say that not only the FET and HEMT but also amplifying elements, such as a Laterally Doped Metal-Oxide-Semiconductor Field Effect Transistor (LD-MOS) and a Hetero-junction Bipolar Transistor (HBT), and a Micro Electro Mechanical Systems (MEMS) element, etc. are applicable.

While certain embodiments have been described, these embodiments have been presented by way of examples only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high frequency module comprising:
a semiconductor device;
an input matching circuit disposed at an input side of the semiconductor device;
an output matching circuit disposed at an output side of the semiconductor device;
a high temperature operating use gate bias circuit connected to the input matching circuit;
an operating use gate bias circuit connected to the input matching circuit;
a high temperature operating use gate bias terminal connected to the high temperature operating use gate bias circuit;
an operating use gate bias terminal connected to the operating use gate bias circuit;
a high frequency input terminal connected to the input matching circuit;
a drain bias circuit connected to the output matching circuit;
a drain bias terminal connected to the drain bias circuit; and
a high frequency output terminal connected to the output matching circuit, wherein
the semiconductor device, the input matching circuit, the output matching circuit, the high temperature operating use gate bias circuit, the operating use gate bias circuit, and the drain bias circuit are housed by one package.

2. The high frequency module according to claim 1, wherein
the operating use gate bias circuit includes a bleeder resistance circuit, and
the operating use gate bias terminal is connected to a gate terminal of the semiconductor device via the bleeder resistance circuit.

3. The high frequency module according to claim 1, wherein
the high temperature operating use gate bias circuit includes a first electrode pattern, and
the high temperature operating use gate bias terminal is connected to the gate terminal of the semiconductor device via the first electrode pattern.

4. The high frequency module according to claim 3, wherein
the drain bias circuit includes a second electrode pattern, and
the drain bias terminal is connected to the drain terminal of the semiconductor device via the second electrode pattern.

5. The high frequency module according to claim 2, wherein
the bleeder resistance circuit comprises:
a first bleeder resistance connected to the operating use gate bias terminal; and
a second bleeder resistance series-connected between ground potential and the first bleeder resistance, wherein
a voltage supplied to the operating use gate bias terminal is applied to the gate terminal of the semiconductor device by resistive voltage dividing of the first bleeder resistance and the second bleeder resistance.

6. The high frequency module according to claim 3, wherein
a voltage supplied to the high temperature operating use gate bias terminal is applied to the gate terminal of the semiconductor device.

7. The high frequency module according to claim 4, wherein
a voltage supplied to the drain bias terminal is applied to the drain terminal of the semiconductor device.

8. The high frequency module according to claim 1 further comprising:
a first DC cutoff capacitor connected between the high frequency input terminal and the input matching circuit; and
a second DC cutoff capacitor connected between the high frequency output terminal and the output matching circuit.

9. The high frequency module according to claim 1, wherein
the semiconductor device comprises:
a semi-insulating substrate;
a gate finger electrode, a source finger electrode, and a drain finger electrode disposed on a first surface of the semi-insulating substrate, and have a plurality of fingers, respectively;
a plurality of gate terminal electrodes, a plurality of source terminal electrodes, and a drain terminal electrode disposed on the first surface of the semi-insulating substrate and tie a plurality of fingers, respectively for each of the gate finger electrode, the source finger electrode, and the drain finger electrode;
a VIA hole disposed at a lower part of a source terminal electrode; and
a ground electrode disposed on a second surface of the opposite side of the first surface of the semi-insulating substrate, and is connected via the VIA hole for the source terminal electrode.

10. The high frequency module according to claim 9, wherein
the semi-insulating substrate is one of a GaAs substrate, an SiC substrate, a GaN substrate, a substrate formed of a GaN epitaxial layer on the SiC substrate, a substrate formed of a heterojunction epitaxial layer composed of GaN/AlGaN on the SiC substrate, a sapphire substrate, and a diamond substrate.

11. A high frequency module comprising:
a semiconductor device;
an input matching circuit disposed at an input side of the semiconductor device;
an output matching circuit disposed at an output side of the semiconductor device;
an operating use gate bias circuit connected to the input matching circuit;
an operating use gate bias terminal connected to the operating use gate bias circuit;
a high frequency input terminal and high temperature operating use gate bias terminal connected to the input matching circuit;
a drain bias circuit connected to the output matching circuit;
a drain bias terminal connected to the drain bias circuit; and
a high frequency output terminal connected to the output matching circuit, wherein
the semiconductor device, the input matching circuit, the output matching circuit, the operating use gate bias circuit, and the drain bias circuit are housed by one package.

12. The high frequency module according to claim 11, wherein
the operating use gate bias circuit includes a bleeder resistance circuit, and
the operating use gate bias terminal is connected to a gate terminal of the semiconductor device via the bleeder resistance circuit.

13. The high frequency module according to claim 11 further comprising
a DC cutoff capacitor connected externally of the high frequency input terminal and high temperature operating use gate bias terminal.

14. The high frequency module according to claim 13, wherein
an input signal is supplied to the semiconductor device via the DC cutoff capacitor, and a potential of a gate terminal electrode of the semiconductor device is controlled by supplying a gate bias voltage to the high frequency input terminal and high temperature operating use gate bias terminal at the time of high temperature operating use.

15. The high frequency module according to claim 11, wherein
the drain bias circuit includes an electrode pattern, and
the drain bias terminal is connected to the drain terminal of the semiconductor device via the electrode pattern.

16. The high frequency module according to claim 12, wherein
the bleeder resistance circuit comprises:
a first bleeder resistance connected to the operating use gate bias terminal; and
a second bleeder resistance series-connected between ground potential and the first bleeder resistance, wherein
a voltage supplied to the operating use gate bias terminal is applied to the gate terminal of the semiconductor device by resistive voltage dividing of the first bleeder resistance and the second bleeder resistance.

17. The high frequency module according to claim 14, wherein
a voltage supplied to the drain bias terminal is applied to the drain terminal of the semiconductor device.

18. The high frequency module according to claim 11 further comprising
a DC cutoff capacitor connected between the high frequency output terminal and the output matching circuit.

19. The high frequency module according to claim 11, wherein
the semiconductor device comprises:
a semi-insulating substrate;
a gate finger electrode, a source finger electrode, and a drain finger electrode disposed on a first surface of the semi-insulating substrate, and have a plurality of fingers, respectively;
a plurality of gate terminal electrodes, a plurality of source terminal electrodes, and a drain terminal electrode disposed on the first surface of the semi-insulating substrate and tie a plurality of fingers, respectively for each of the gate finger electrode, the source finger electrode, and the drain finger electrode;
a VIA hole disposed at a lower part of a source terminal electrode; and a ground electrode disposed on a second surface of the opposite side of the first surface of the semi-insulating substrate, and is connected via the VIA hole for the source terminal electrode.

20. The high frequency module according to claim 19, wherein the semi-insulating substrate is one of a GaAs substrate, an SiC substrate, a GaN substrate, a substrate formed of a GaN epitaxial layer on the SiC substrate, a substrate formed of a heterojunction epitaxial layer composed of GaN/AlGaN on the SiC substrate, a sapphire substrate, and a diamond substrate.

21. An operating method of a high frequency module, the high frequency module comprising: a semiconductor device, an input matching circuit disposed at an input side of the semiconductor device; an output matching circuit disposed at an output side of the semiconductor device; an operating use gate bias circuit connected to the input matching circuit; an operating use gate bias terminal connected to the operating use gate bias circuit; a high frequency input terminal and high temperature operating use gate bias terminal connected to the input matching circuit; a drain bias circuit connected to the output matching circuit; a drain bias terminal connected to the drain bias circuit; and a high frequency output terminal connected to the output matching circuit, wherein the semiconductor device, the input matching circuit, the output matching circuit, the operating use gate bias circuit, and the drain bias circuit are housed by one package, the operating method comprising:

controlling, at the time of operating use, a potential of a gate terminal electrode of the semiconductor device via the operating use gate bias circuit;

supplying, at the time of operating use, an input signal to the semiconductor device via a DC cutoff capacitor connected to externally of the high frequency input terminal and high temperature operating use gate bias terminal; and controlling, at the time of high temperature operating use, the potential of the gate terminal electrode of the semiconductor device by supplying a gate bias voltage to the high frequency input terminal and high temperature operating use gate bias terminal.

22. The operating method according to claim 21, wherein the operating use gate bias circuit includes a bleeder resistance circuit, and controls the potential of the gate terminal electrode of the semiconductor device via the said bleeder resistance circuit at the time of operating use.

* * * * *